(12) United States Patent
Haerle et al.

(10) Patent No.: US 7,710,704 B2
(45) Date of Patent: May 4, 2010

(54) DRIVE CIRCUIT FOR A FIRING ELEMENT OF AN OCCUPANT PROTECTION SYSTEM

(75) Inventors: Dieter Haerle, Villach (AT); Alexander Mayer, Treffen (AT); Hubert Rothleitner, Villach (AT)

(73) Assignee: Infineon Technolgies AG, Munich (DE)

( * ) Notice: Subject to any disclaimer, the term of this patent is extended or adjusted under 35 U.S.C. 154(b) by 377 days.

(21) Appl. No.: 11/338,438

(22) Filed: Jan. 24, 2006

(65) Prior Publication Data

US 2006/0192599 A1 Aug. 31, 2006

(30) Foreign Application Priority Data

Jan. 24, 2005 (DE) ................ 10 2005 003 245

(51) Int. Cl.
*H02H 5/04* (2006.01)
(52) U.S. Cl. ..................... 361/103; 307/10.1
(58) Field of Classification Search .............. 361/103; 307/10.1
See application file for complete search history.

(56) References Cited

U.S. PATENT DOCUMENTS

| | | | | |
|---|---|---|---|---|
| 3,710,193 | A * | 1/1973 | Greenberg et al. | 361/709 |
| 5,828,200 | A * | 10/1998 | Ligman et al. | 318/807 |
| 6,191,625 | B1 * | 2/2001 | Wachter et al. | 327/108 |
| 6,717,788 | B2 * | 4/2004 | Sommer et al. | 361/103 |
| 2001/0006309 | A1 | 7/2001 | Ueno et al. | |
| 2004/0108698 | A1 | 6/2004 | Rothleitner | |
| 2005/0127755 | A1 * | 6/2005 | Aichriedler et al. | 307/10.1 |

FOREIGN PATENT DOCUMENTS

| | | |
|---|---|---|
| DE | 295 10 275 U1 | 10/1995 |
| DE | 19522517 C1 | 11/1996 |
| DE | 196 17 250 C1 | 9/1997 |
| DE | 199 34 559 C1 | 1/2001 |
| DE | 10109620 C1 | 6/2002 |
| DE | 101 21 881 A1 | 11/2002 |
| DE | 20315053 U1 | 1/2004 |
| DE | 10312009 B3 | 4/2004 |
| DE | 102 55 115 B3 | 7/2004 |
| DE | 100 06 526 B4 | 9/2004 |
| DE | 103 44 841 A1 | 5/2005 |
| WO | WO 97/32757 | 9/1997 |

* cited by examiner

*Primary Examiner*—Jared J Fureman
*Assistant Examiner*—Nicholas Ieva
(74) *Attorney, Agent, or Firm*—Maginot, Moore & Beck

(57) ABSTRACT

A drive circuit for a firing element of an occupant protection system comprises first and second supply potential terminals and first and second firing element terminals. A first semiconductor switching element is integrated in a first semiconductor body and has a first load terminal coupled to the first supply potential terminal and a second load terminal coupled to the first firing element terminal. A second semiconductor switching element is integrated in a second semiconductor body and has a first load terminal coupled to the second firing element terminal and a second load terminal coupled to the second supply potential terminal. The first and second semiconductor bodies are applied to a thermally conductive carrier element and commonly housed. A temperature detector is integrated in the second semiconductor body and provides an overtemperature signal at an output of the drive circuit upon detection of an overtemperature of the first semiconductor switching element.

18 Claims, 7 Drawing Sheets

DRIVE CIRCUIT FOR A FIRING ELEMENT OF AN OCCUPANT PROTECTION SYSTEM

BACKGROUND

The present invention relates to a drive circuit for a firing element of an occupant protection system of a motor vehicle.

Occupant protection systems of a motor vehicle are airbag or seatbelt pretensioners, by way of example. Protection systems of this type are triggered by a firing element, for example a pyrotechnic firing pellet, which initiates further operations for opening an airbag or for tensioning a seat belt. The firing pellet is usually activated by a predetermined activation current/firing current, for example 1 A to 3 A, being applied to it for a predetermined activation duration, for example 0.5 ms to 5 ms, by a drive circuit.

For safety reasons, the drive circuit must have at least two switching elements which are connected into the load circuit of the firing element in the drive circuit and which isolate the firing element in each case from supply potentials. In this case, both must be driven in conducting fashion for activation of the firing element. Such a drive circuit for a firing element of an occupant protection system is disclosed for example in the publications DE 196 17 250 C1, DE 199 34 559 C1, US 2001/0006309 A1 or DE 102 55 115 B3.

Referring to cited DE 102 55 115 B3, known drive circuits for such firing elements are constructed such that the two semiconductor components or semiconductor switches with which the firing element is connected in series are integrated in a common semiconductor body or semiconductor chip. This integration of the two semiconductor switches on a semiconductor chip may have the effect that in the event of a serious fault on the chip, for example triggered by an uncontrolled influence externally, an uncontrolled activation (IAD=inadvertent deployment) of the occupant protection system may occur.

A complete redundancy of the system, in the sense that when there is a fault in one semiconductor switching element, the other semiconductor switching element reliably prevents faulty triggering of the firing element, is not completely provided when both switching elements are integrated on a chip. Faults on the semiconductor chip which may lead for example to one semiconductor switch being switched on unintentionally may in many cases also lead to the second semiconductor switch being switched on unintentionally.

In order to avoid this disadvantage, DE 101 09 620 C1 discloses providing two integrated drive circuits of identical type each having two semiconductor switching elements and connecting up these two drive circuits in cross-coupled fashion. In this case, a firing element is connected in each case between a semiconductor switching element of one drive circuit and a semiconductor switching element of the other drive circuit. In the case of a cross-coupled circuit, therefore, provision is made for using semiconductor switches of different drive circuits for driving a firing element. A disadvantage of such an arrangement is the comparatively complex wiring, particularly in the case of multichannel systems in which more than two firing pellets are intended to be driven.

WO 97/32757 discloses a drive circuit for a firing element of an occupant protection system in which two semiconductor switches provided for driving a firing element are realized as discrete components, that is to say as components which are integrated in different semiconductor bodies.

The applicant's hitherto unpublished application DE 103 44 841.1 describes a drive circuit for a firing element of an occupant protection system, in which two semiconductor switches provided for driving a firing element are integrated in different semiconductor bodies which are applied to a common carrier and are arranged in a common chip housing.

In the case of such an arrangement of the two semiconductor switching elements in a common chip housing, a fault in one semiconductor switching element, for example thermal overheating of a component on account of a short circuit, may lead to an undesirable activation of the other semiconductor switching element and thus to an undesirable firing of the firing element.

Therefore, it would be advantageous to provide a drive circuit for a firing element of an occupant protection system which has at least two semiconductor switching elements which are integrated in separate semiconductor bodies and are arranged in a common chip housing, and which has a reduced susceptibility to disturbances.

SUMMARY

A drive circuit for a firing element of an occupant protection system comprises first and second supply potential terminals, first and second firing element terminals, at least one first semiconductor switching element which is integrated in a first semiconductor body, at least one second semiconductor switching element, which is integrated in a second semiconductor body, a thermally conductive carrier element to which the first and second semiconductor bodies are applied, and a chip housing surrounding the first and second semiconductor bodies.

The first semiconductor switching element has a first load terminal coupled to the first supply potential terminal and a second load terminal coupled to the first firing element terminal. The second semiconductor switching element has a first load terminal coupled to the second firing element terminal and a second load terminal coupled to the second supply potential terminal.

It should be pointed out that "coupling" of the load terminals of the semiconductor switching elements to supply potential terminals or firing element terminals in the context of the invention is to be understood either as directly connecting the respective load terminal to the respective supply potential or firing element terminal, or connecting it indirectly via a further component, for example a diode or a further switching element.

For detecting an overtemperature of the first semiconductor switching element, a temperature detector is present which is integrated in the second semiconductor body and which provides an overtemperature signal at an output upon detection of an overtemperature.

As an alternative, there is the possibility of integrating the temperature detector in a third semiconductor body, which is separate from the first and second semiconductor bodies and which is likewise arranged on the carrier element.

A response of the temperature detector integrated in the second or third semiconductor body in the event of an overtemperature of the first semiconductor switching element integrated in the first semiconductor body is ensured by the thermally conductive carrier element which thermally couples the first and second semiconductor bodies to one another. The arrangement of the two semiconductor switching elements in separate semiconductor bodies in this case ensures that even a temperature-dictated destruction of the first semiconductor body does not lead directly to a destruction of the second semiconductor body.

The semiconductor bodies with the semiconductor switching elements and the temperature detector may be arranged on the same side of the usually flat carrier element or on opposite sides of the carrier element.

The drive circuit may be used for example together with a control circuit to which the overtemperature signal is fed and which initiates suitable measures, for example turning off the supply voltage, in the event of a detected overtemperature.

The carrier element may be formed as a conventional leadframe and comprises for example a metal such as copper, aluminum or a further conventional leadframe material. A carrier having a metallic basic material and a further metal layer which is vapor-deposited thereon or applied thereto in some other way can also be used. Furthermore, the carrier element can also be formed as a so-called DCB substrate (DCB=Direct Copper Bonding), comprising a ceramic carrier with an electrically conductive layer applied thereto, usually made of copper.

One embodiment provides for the first and second semiconductor bodies to be electrically conductively connected to the carrier element, while in another embodiment the first and second semiconductor bodies are connected to the carrier element in thermally conductive but electrically insulating fashion.

BRIEF DESCRIPTION OF THE DRAWINGS

The present invention is explained in more detail below with reference to figures.

In the figures, unless specified otherwise, identical reference symbols designate identical circuit components and signals with the same meaning.

DESCRIPTION

Figure 1:
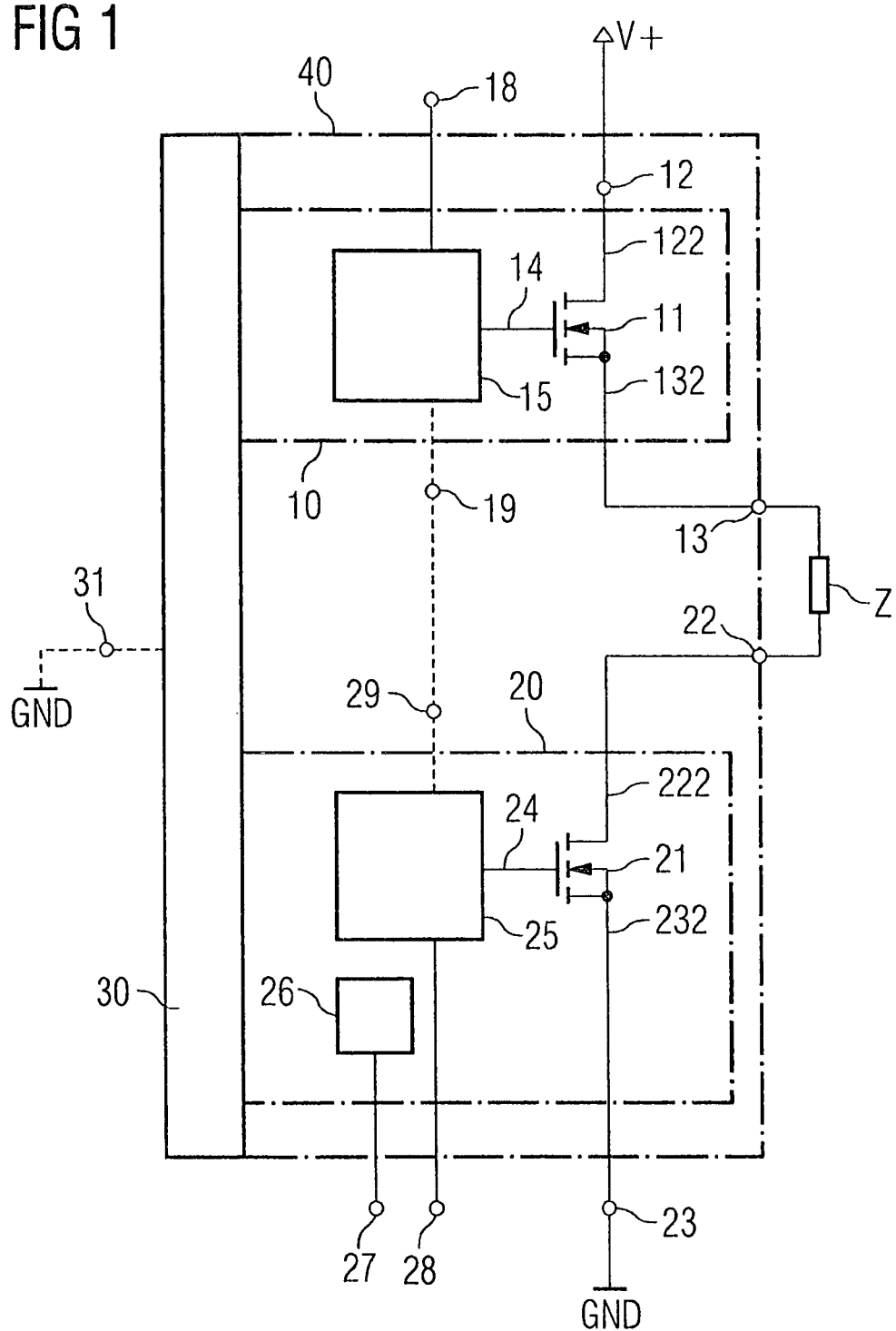
FIG. 1—shows a drive circuit according to the invention with two semiconductor switching elements which are integrated in separate semiconductor bodies and are applied to a thermally conductive carrier element.

FIG. 1 shows at the circuit level an exemplary embodiment of the drive circuit according to the invention for a firing element of an occupant protection system. The drive circuit comprises first and second supply potential terminals 12, 23, which serve for connecting the drive circuit to terminals for supply terminals V+, GND, and also first and second firing element terminals 13, 22, which serve for connecting a firing element Z. Such a firing element Z, which is not part of the drive circuit, is likewise illustrated in FIG. 1 in order to afford a better understanding.

The drive circuit has a first semiconductor switching element 11 and a second semiconductor switching element 21 which are each formed as an n-channel MOSFET in the example. The two semiconductor switching elements 11, 21 are integrated in separate semiconductor bodies 10, 20 which are illustrated schematically as dash-dotted blocks in FIG. 1. The first semiconductor switching element 11 integrated in a first semiconductor body (die) 10 has a first load terminal 122 connected to the first supply terminal 12 and a second load terminal 132 connected to the first firing element terminal 13. The second semiconductor switching element 21 integrated in a second semiconductor body 20 has a first load terminal 222 connected to the second firing element terminal 22 and a second load terminal 232 connected to the second supply terminal potential 23. In the example, the first load terminals 122, 222 of the two semiconductor switching elements 11, 21 are drain terminals of the MOSFETs, while the second load terminals 132, 232 are the source terminals thereof.

For driving the semiconductor switching elements 11, 21, driver circuits 15, 25 are present, which are in each case connected to the control terminals 14, 24, the gate terminals in the example of the semiconductor switching elements 11, 21.

The firing element Z fires if suitable supply potentials are present between the supply potential terminals 12, 23 of the drive circuit, said supply potentials being designated by V+ for a positive supply potential and GND for a reference-ground potential in FIG. 1 and if both semiconductor switching elements 11, 21 are driven in conducting fashion, so that a defined current flows through the firing element Z for a predetermined time duration. The detection of an accident event requiring a triggering firing element Z is effected by means of sufficiently known acceleration or impact sensors.

In order to drive the two semiconductor switching elements 11, 21 in conducting fashion with the aim of triggering the firing element Z, there is the possibility of feeding drive signals for the two semiconductor switching elements to the driver circuits 15, 25 separately via terminals 18, 28. Said drive signals are generated for example by a microcontroller connected to impact or acceleration sensors. Furthermore, there is also the possibility of feeding a firing signal only to the driver circuit of one of the two semiconductor switching elements, for example the driver circuit 25 of the second semiconductor switching element 21, and of configuring the second driver circuit 25 in this case such that the latter generates internally in the drive circuit a firing signal for the first semiconductor switch 11, which firing signal is fed to the first driver circuit 15. The reference symbols 19, 29 designate terminals of the first and second driver circuits 15, 25 via which such a firing signal can be fed to the second driver circuit 25 from the first driver circuit 15. The external terminal 18 of the first driver circuit 15 can be dispensed with in this case.

The first and second semiconductor bodies 10, 20 with the first and second semiconductor switching elements 11, 21 integrated therein are arranged jointly on a thermally conductive carrier 30, which thermally couples the two semiconductor bodies 10, 20 to one another.

A temperature sensor 26 is furthermore integrated in the second semiconductor body 20, said semiconductor being designed to detect the presence of an overtemperature in the second semiconductor body 20 and to provide an overtemperature signal OTS at a detector output 27 upon detection of such an overtemperature. Said overtemperature signal OTS may be utilized in a manner yet to be explained, for example for turning off the voltage supply of the drive circuit 40 in order, on detection of such an overtemperature, primarily to prevent faulty firing of the firing element Z.

In particular, the first semiconductor switching element 11, which is connected to the positive supply potential V+ during operation, can heat up greatly when a faulty operating state is present.

Such a fault state is present, for example, if the supply potential V+ defectively exceeds a maximum permitted operating voltage, which leads to local damage in the semiconductor body 10, which is usually composed of silicon. This local damage leads to thermal overheating with the continuing presence of an excessively high supply potential.

Overheating may also be caused by mechanical damage that may arise during the production process in the course of bonding, that is to say fitting terminal bonding wires to the semiconductor bodies, or in the course of applying the semiconductor bodies 10, 20 to the carrier 30. Such mechanical damage, which is possibly not identified directly after production, may lead to an increased absorption of energy if a current flows through the component in an uncontrolled manner on account of the damage.

Thermal overheating of the first semiconductor body 10 may lead to an uncontrolled activation of the semiconductor switching element arranged therein.

The two semiconductor bodies 10, 20 are arranged in a common chip housing 40, which may comprise a conventional housing material, such as plastic molding compound, for example. On account of this arrangement of the two semiconductor bodies 10, 20 in the common housing 40, great heating of the first semiconductor body 10, even without a thermally conductive carrier 30 being present, could lead to the second semiconductor body 20 being heated to such a great extent that a fault state occurs in which the second semiconductor switching element 21 switches on, which, in the case where a first semiconductor switching element 11 is likewise switched on defectively, may lead to a firing of the firing element Z. The thermally conductive carrier in the drive circuit according to the invention has the effect, then, that in the case where the first semiconductor body 10 is heated defectively, the second semiconductor body 20 heats up uniformly in order, by means of the temperature detector 26 integrated in the second semiconductor body 20, to be able to detect a fault-dictated overheating of the first semiconductor body 10. Owing to the spatial separation of the first and second semiconductor bodies 10, 20 the temperature of the second semiconductor body 20 will usually remain below the temperature of the first semiconductor body 10 due to a resulting temperature gradient. It is ensured, however, that the circuit components arranged in the second semiconductor body 20, in particular the temperature detector 26, still functions—at least for a certain time duration—even in the extreme case if the first semiconductor body 10 should heat up due to a fault to such a great extent that a destruction of the circuit components arranged therein occurs.

Figure 2A:
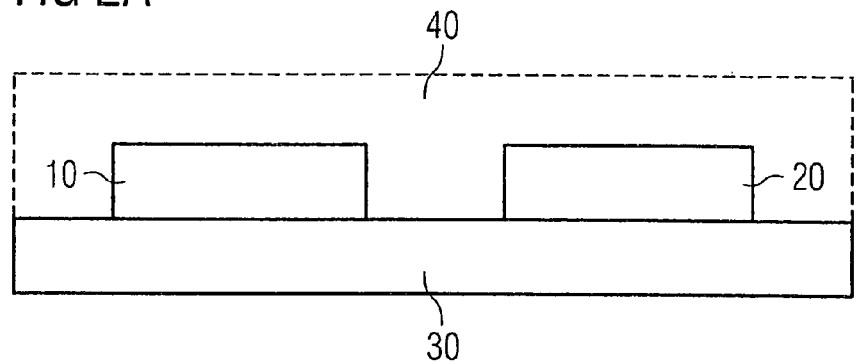
FIG. 2—shows a cross section through a housing of the drive circuit in accordance with FIG. 1 in side view (FIG. 2a) and in plan view (FIG. 2b).
Figure 2B:
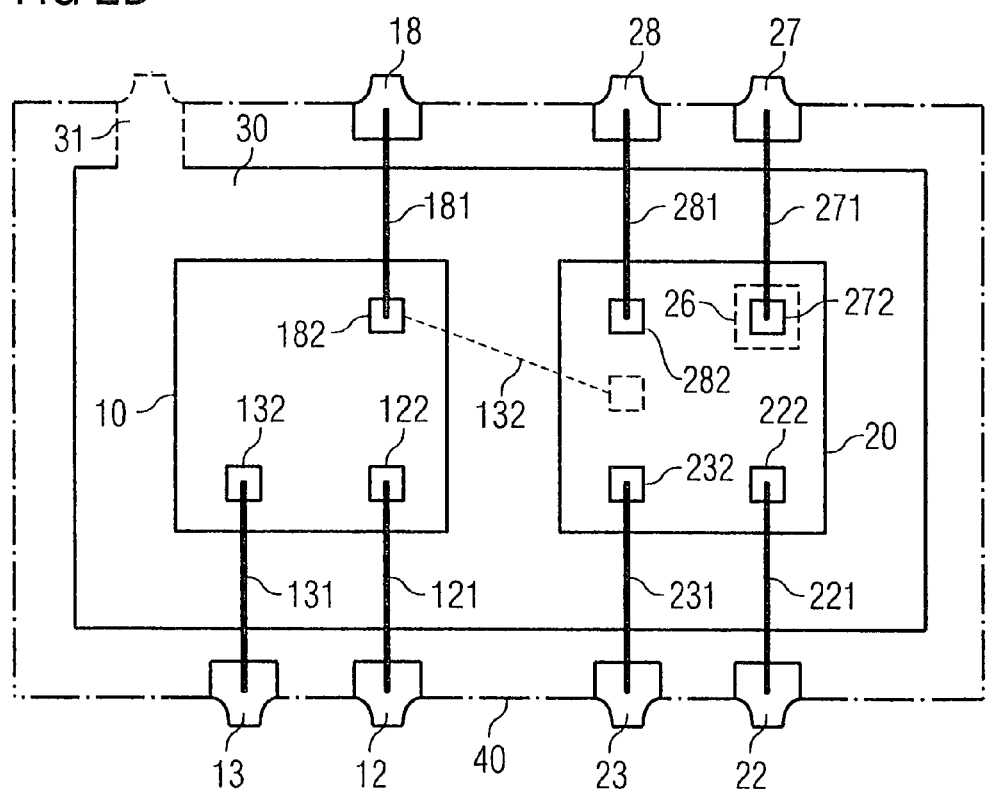

FIG. 2 shows the drive circuit according to the invention at the package level. In this case, FIG. 2a shows a cross section through the housing 40 with the semiconductor bodies 10, 20 arranged therein, in side view in cross section, while FIG. 2b shows a cross section through the housing 40 in plan view. The two semiconductor bodies 10, 20 with the semiconductor switching elements (11, 21 in FIG. 1) integrated therein are applied to the thermally conductive carrier 30 in a manner spaced apart from one another. Said carrier 30 may be a conventional leadframe made of copper or aluminum. A carrier 30 having a metallic basic material and a metal layer which is vapor-deposited thereon or applied thereto in some other way is also conceivable. Carriers made of composite materials such as, for example, so-called DCB substrates having a ceramic carrier or a known PCB material with a metal layer applied thereto, usually copper, can furthermore be used.

Referring to FIG. 2a, the housing 40 may be configured in such a way that it completely surrounds the semiconductor bodies 10, 20 above the carrier 30 but that a rear side of the carrier 30 remote from the semiconductor bodies 10, 20 is uncovered.

Furthermore, there is also the possibility of mounting one of the semiconductor bodies 10, 20 on a front side of the carrier 30 and the other of the semiconductor bodies 10, 20 on a rear side of the carrier 30 remote from the front side. In this case, too, the carrier 30 provides for sufficient thermal coupling between the two semiconductor bodies 10, 20. Furthermore, in a manner not illustrated, there is also the possibility of the housing 40 completely surrounding the carrier 30 with the semiconductor bodies 10, 20 applied thereto.

Referring to FIG. 2b, terminal legs project from the housing 40 and form the external terminals of the drive circuit. The reference symbols of the terminal terminals in accordance with FIG. 1 are used for the terminal legs in FIG. 2b in order to afford a better understanding. Said terminal legs are connected via bonding wires to associated terminal contacts of the semiconductor bodies 10, 20 which are arranged on those sides of said semiconductor bodies 10, 20 which are remote from the carrier 30. The terminal contacts from the first and second load terminals 122, 132 of the first semiconductor switching element are in this case connected via bonding wires 121, 131 to the respective terminal legs 12, 13. Correspondingly, terminal contacts for the first and second load terminals 222, 232 of the second semiconductor switching element are connected via bonding wires 221, 231 to the associated terminal legs 22, 23. Terminal contacts 182, 282 of the two semiconductor bodies 10, 20 serve for feeding in drive signals for the driver circuits (15, 25 in FIG. 1) integrated in the semiconductor bodies 10, 20. Depending on the embodiment, the two terminal contacts 182, 282 are connected via bonding wires 181, 281 to terminal legs 18, 28 which serve for feeding in separate drive signals for the two semiconductor switching elements. As already explained, however, there is also the possibility of driving the first semiconductor switching element internally by means of the driver circuit of the second semiconductor switching element. The terminal leg 18 and the associated bonding wire 181 can be dispensed with in this case. A drive signal is fed to the terminal contact 182, in this case via a further bonding wire 132 from a terminal 232 of the second semiconductor body 20. The terminal contact 182 on the first semiconductor body 10 fulfills the function of the internal terminal 19 in accordance with FIG. 1, and the terminal 232 on the second semiconductor body 20 fulfills the function of the internal terminal 29 in accordance with FIG. 1.

Depending on the configuration of the semiconductor switching elements integrated in the semiconductor bodies 10, 20, the carrier 30 may be connected to the reference-ground potential GND of the drive circuit. Referring to FIG. 2b, an additional terminal leg 31 may be provided for the purpose of connecting the reference-ground potential to the carrier 30, which additional terminal leg projects from the housing 40 and, in particular, may be integrally formed in one piece on the carrier 30. In particular carriers which are completely composed of a metallic leadframe material, such as copper or aluminum, for example, are suitable as the carrier in this case.

Figure 3A:
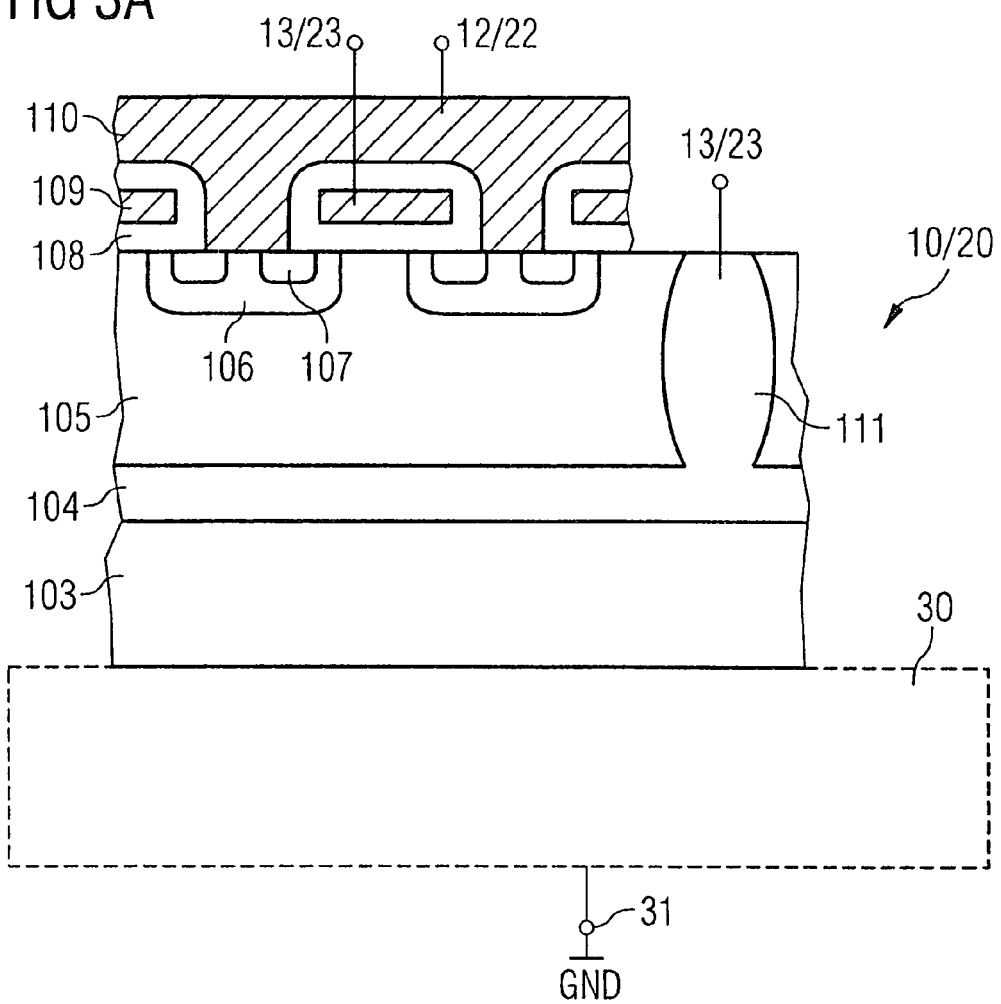
FIG. 3—shows a detail from a cross section through a semi-conductor body with a semiconductor switching element integrated therein.

The two semiconductor bodies 10, 20, may be electrically conductively connected to the carrier 30 if those sides of the semiconductor bodies which face the carrier 30 do not have voltage-carrying terminals. One example of such a component is a vertical power transistor illustrated partially in cross section in FIG. 3. This transistor is based on a semiconductor substrate 103, which is p-doped in the case of an n-conducting transistor. Situated on said semiconductor substrate 103 is a semiconductor zone 104 forming the drain zone of the component, on which there is situated in turn a semiconductor zone 105 forming the drift zone of the component. The drain zone 104 and the drift zone 105 are n-doped in the case of an n-conducting MOSFET.

The component has a multiplicity of transistor cells of identical type. For this purpose, body zones 106 are introduced into the drift zone 105 in the region of a side remote from the substrate 103. Source zones 107 are arranged in said body zones 106, source zones 107 and body zones 106 usually being jointly contact-connected by a source electrode 110 applied to the semiconductor body. A gate electrode 109 is present for driving the component, which gate electrode is arranged in a manner insulated from the semiconductor body by a gate insulation 108 and serves for forming a conductive channel in the body zones 107 between the source zones 106 and the drift zone 105. The drain zone 104 is led to the front side of the semiconductor body by means of a heavily n-doped terminal zone 111 in order to be able to make contact with both the source zones (via the source electrode 110) and the drain zone via one side of the semiconductor body. In components of this type, the semiconductor substrate 103 is connected to the lowest potential that occurs in the circuit, thereby ensuring that the pn junction between the substrate 103 and the drain zone 104 is always reverse-biased. In this way the rear side of the semiconductor body 103 has no voltage-carrying terminals and can thus be electrically conductively connected to the carrier 30.

Figure 3B:
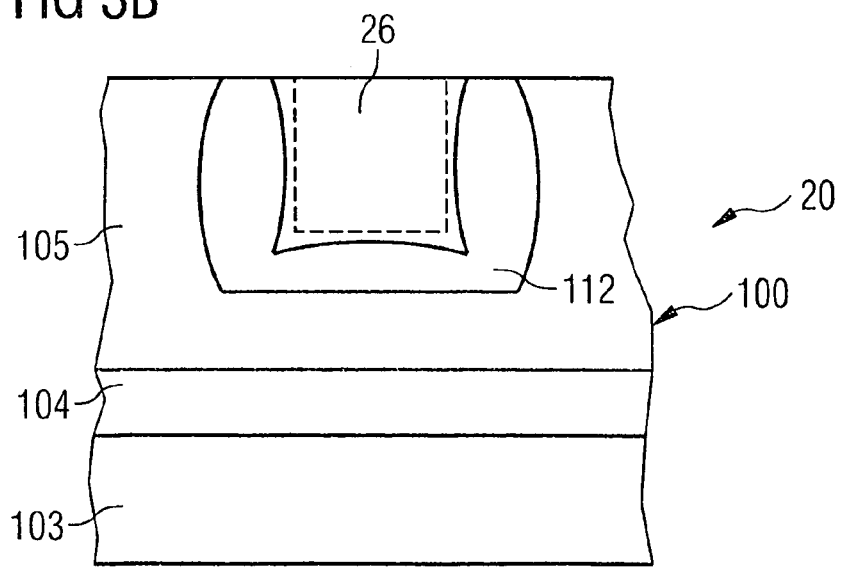

Referring to FIG. 3b the circuit components of the temperature sensor 26 may be integrated in a region of the semiconductor body which is surrounded by a semiconductor zone 112 doped complementarily with respect to the drift zone 105, in order to insulate the components of the temperature sensor 26 in a manner insulated by a pn junction from the device components of the power transistor which forms the semiconductor switching element 21.

It should be pointed out that the two semiconductor switching elements 11, 21 integrated in separate semiconductor bodies may also be realized using different technologies. Thus, there is the possibility, in particular, of realizing the second semiconductor switching element—serving as a high-side switch—in accordance with FIG. 3a and of realizing the first semiconductor switching element—serving as a low-side switch—using BCD technology. In this technology, by way of example, n-doped wells are produced in a p-doped substrate proceeding from one of the sides, the individual components being realized in said wells. During operation of the circuit, the p-type substrate is connected to the most negative potential occurring in the circuit in order to insulate the components in different n-doped wells from one another.

Figure 4:
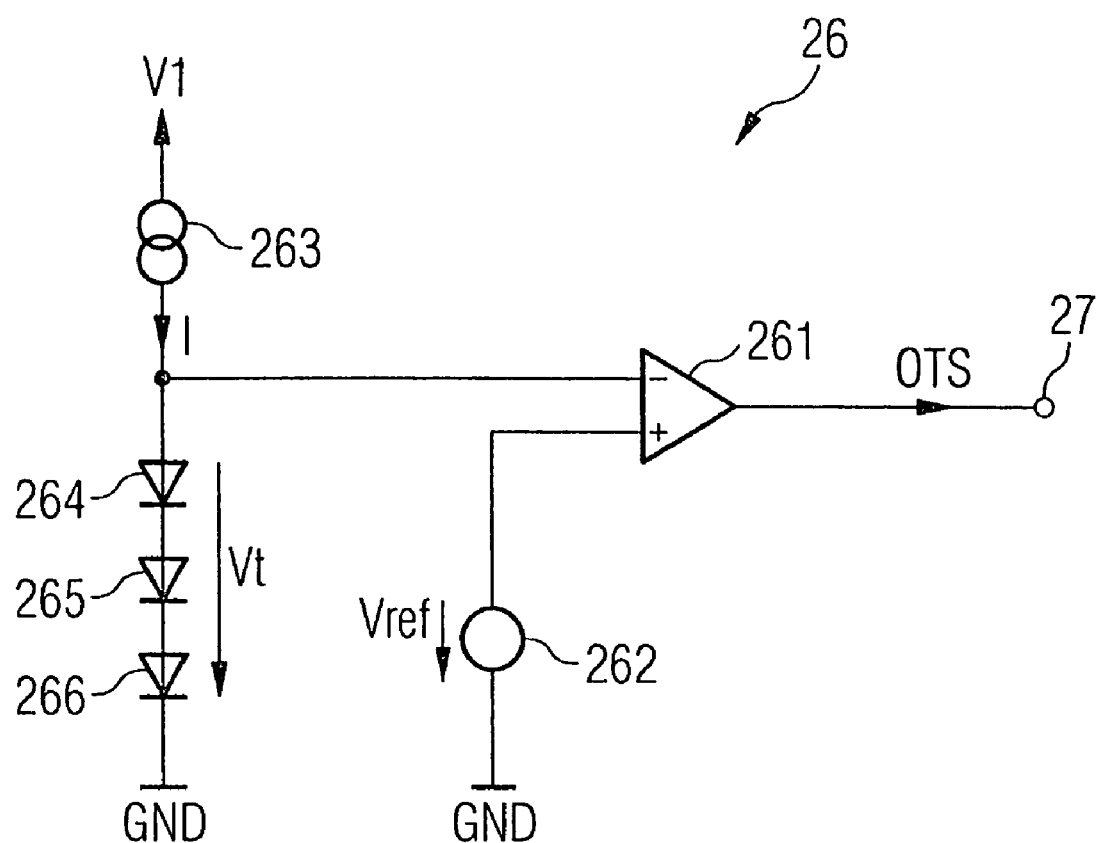
FIG. 4—shows an exemplary circuitry realization of a temperature sensor of the drive circuit.

One example of the realization of a temperature sensor 26 is illustrated in FIG. 4. It comprises a constant-current source 263 connected in series with at least one diode. The circuit arrangement in accordance with FIG. 4 has three such diodes, but more than three diodes in series are also conceivable in order to increase the temperature sensitivity.

A current I, supplied by the current source 263, brings about a temperature-dependent voltage drop Vt across the series circuit formed by said diodes 264-266, which is compared, by means of a comparator 261, with a reference voltage Vref provided by a reference voltage source 262. The overtemperature signal OTS is available at the output of said comparator 261. In the example, in which the reference voltage Vref is fed to the noninverting input of the comparator 261 and the thermal voltage Vt is fed to the inverting input, said overtemperature signal OTS assumes a high level as long as the thermal voltage Vt is less than the reference voltage Vref. As the temperature of the semiconductor region in which the diodes are realized increases, the thermal voltage Vt present across the diodes, which is brought about by the constant current I, decreases. If the temperature in this case rises to an extent such that the thermal voltage Vt falls below the reference value Vref, then the overtemperature signal OTS assumes a high level in order to indicate the presence of an overtemperature.

Figure 5:
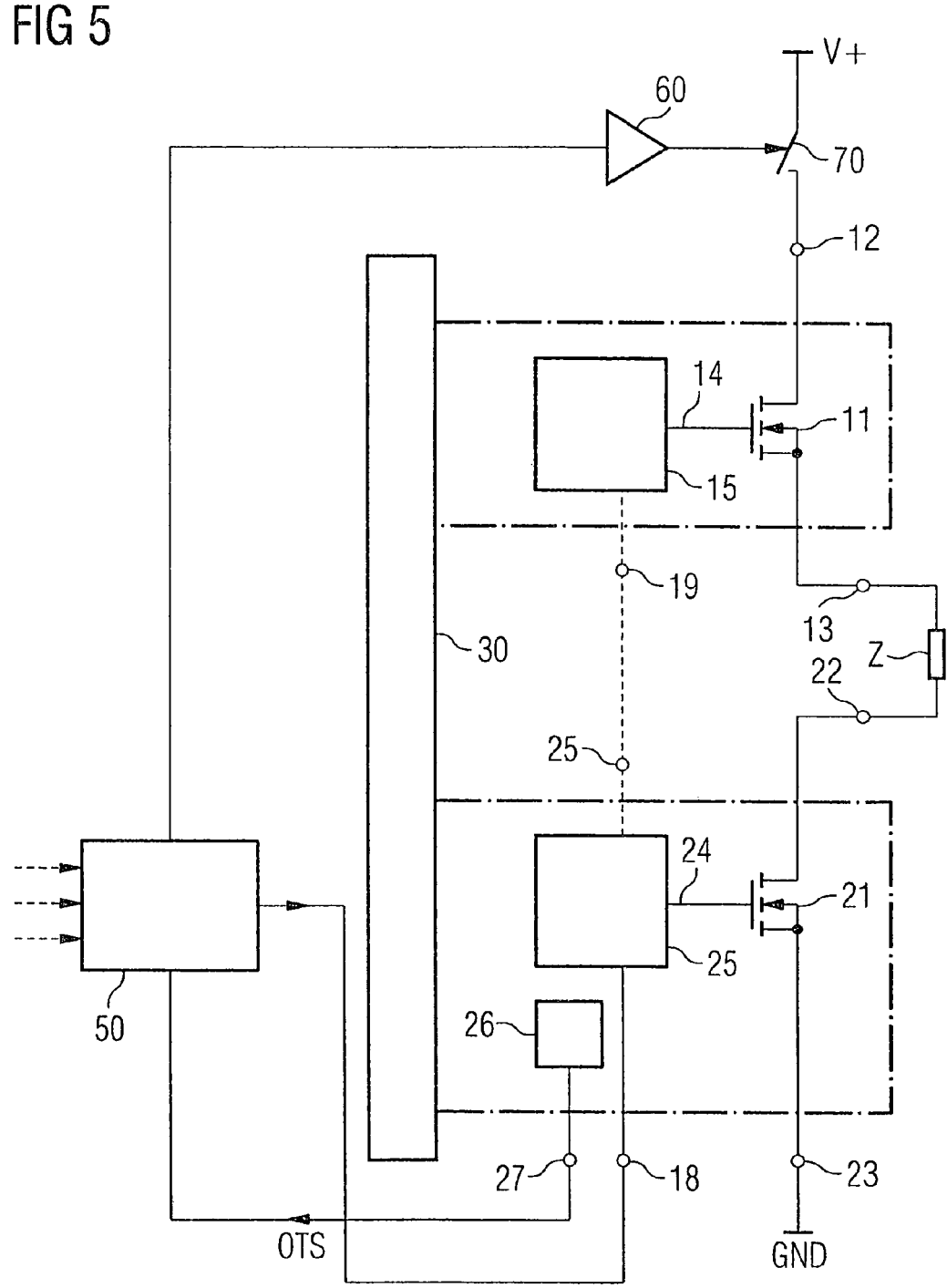
FIG. 5—shows an application circuit for the drive circuit according to the invention.

Referring to FIG. 5, said overtemperature signal OTS may be used for example to interrupt the voltage supply of the drive circuit. A switch 70 is provided for interrupting the voltage supply, said switch being connected between one of the supply potential terminals, the first supply potential terminal 12 in the example, and the supply potential V+. Said switch 70, which may be formed in particular as a semiconductor switching element, is driven by a control circuit 50, for example a microcontroller, to which the overtemperature signal OTS is fed. In order to convert a turn-off signal supplied by the control circuit 50 to a signal level suitable for driving the switch 70, a driver circuit 60 is connected between the control circuit 50 and the switch 70. The control circuit 50 may, in particular, be the control circuit which also generates the firing signals for the semiconductor switching elements 11, 21 depending on sensor signals, which are illustrated as input signals of the control circuit 50 by dashed lines in FIG. 5.

Figure 6:
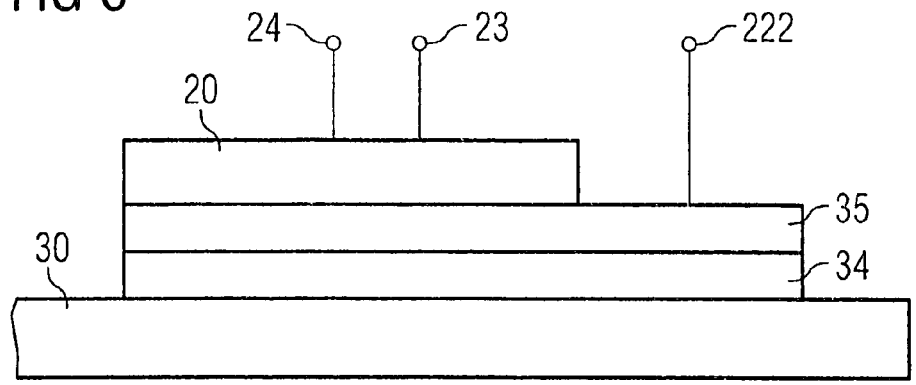
FIG. 6—shows a detail from a drive circuit according to the invention in which a semiconductor body is applied to a carrier element in thermally conductive but electrically insulating fashion.

Referring to FIG. 3, an explanation was given of the possibility of connecting the semiconductor bodies 10, 20 to the carrier 30 in thermally and electrically conductive fashion. Referring to FIG. 6, however, there is also the possibility of the semiconductor bodies indeed being thermally conductively connected to the carrier 30, but being electrically insulated from the carrier 30. This is necessary particularly when the semiconductor bodies have voltage-carrying terminals on the side by which they are intended to be fixed on the carrier. Referring to FIG. 6, in this case, an electrically insulating layer 34 is applied to the carrier, an electrically conductive layer 35 in turn being applied to said electrically insulating layer. Said electrically conductive layer 35 serves for making contact with the component terminal which is situated on that side of the semiconductor body 20 which faces the carrier 30. Such a procedure is necessary particularly when using such vertical power MOSFETs when the drain terminal is not led to the front side, but rather is formed by the rear side of the component.

Suitable materials for the thermally conductive, but electrically insulating layer 34 are ceramic materials, by way of example.

Figure 7:
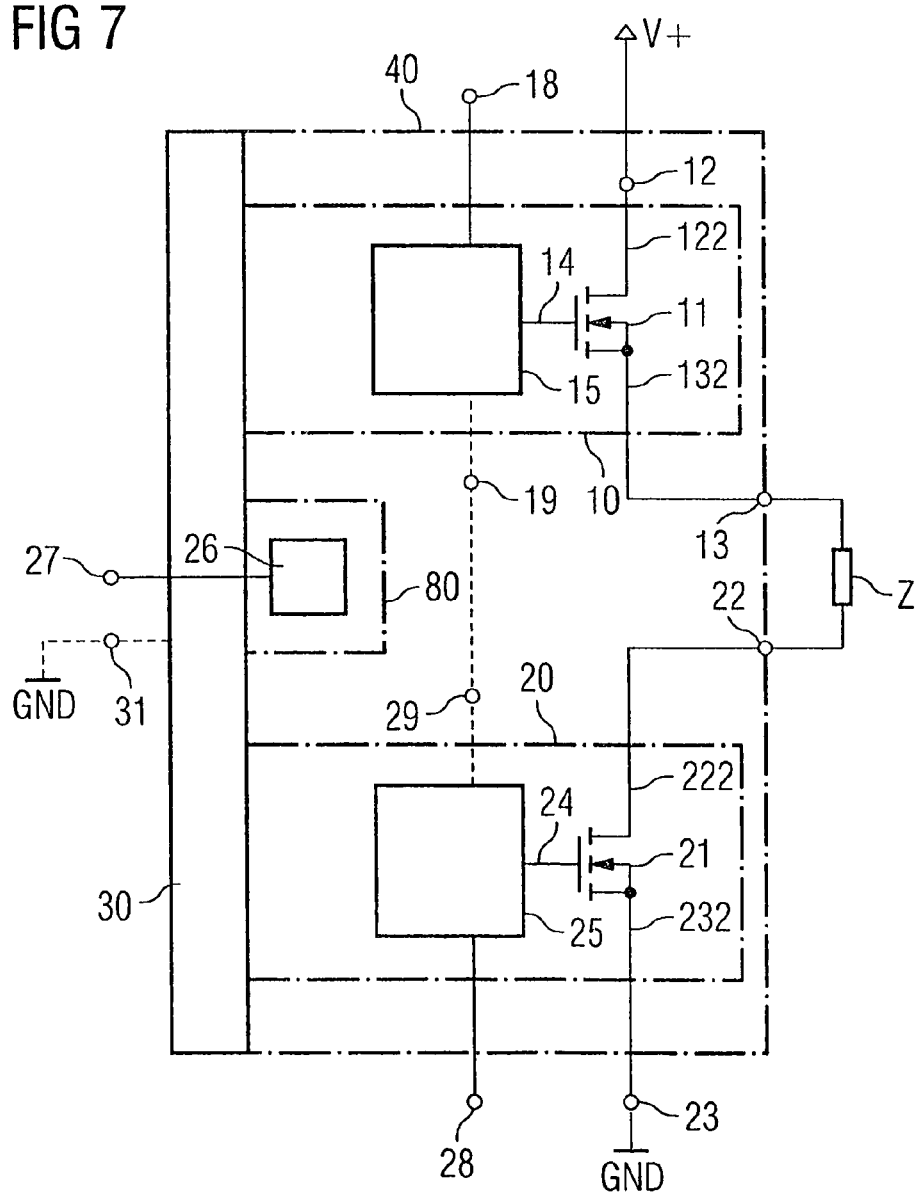
FIG. 7—shows a further exemplary embodiment of a drive circuit according to the invention with two semiconductor switching elements which are integrated in separate semiconductor bodies and are applied to a thermally conductive carrier element, and with a temperature sensor integrated in a separate semiconductor body.
Figure 8A:
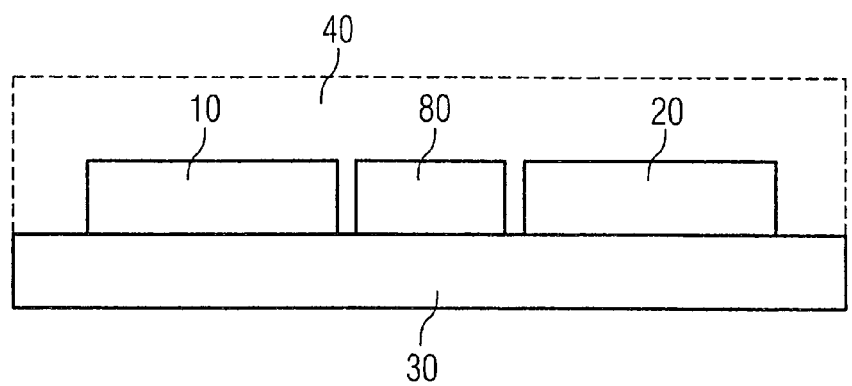
FIG. 8—shows a cross section through a housing of the drive circuit in accordance with FIG. 7 in side view (FIG. 8a) and in plan view (FIG. 8b).
Figure 8B:
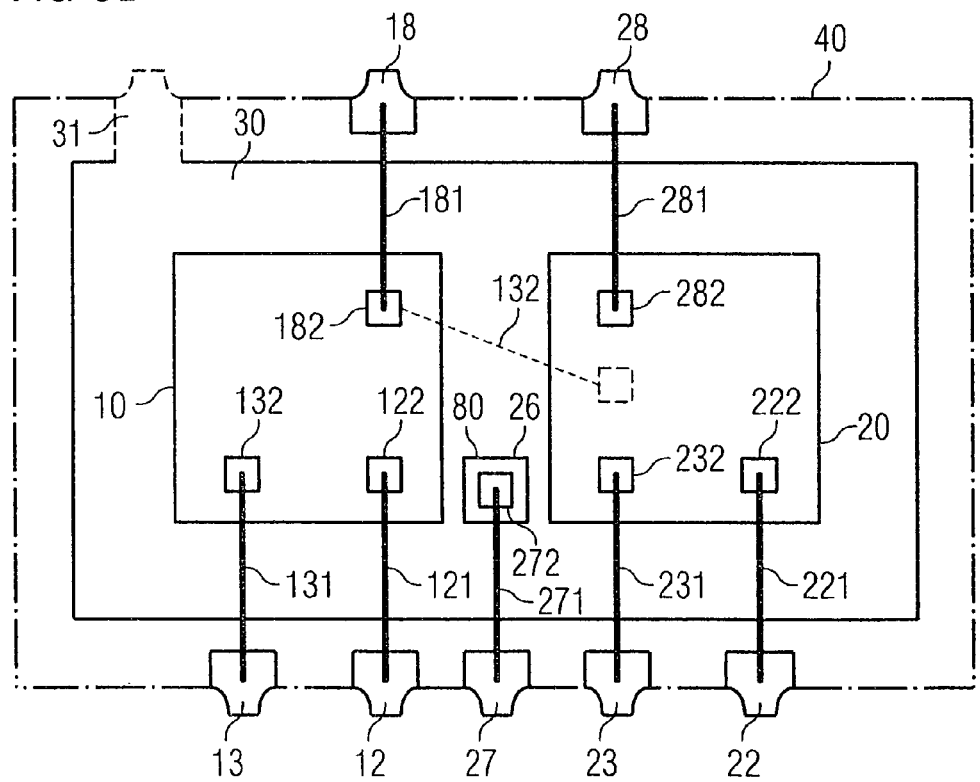

FIGS. 7 and 8 show a further exemplary embodiment of a drive circuit according to the invention. FIG. 7 shows the drive circuit at the circuit level. FIG. 8 shows the drive circuit at the package level in cross section through a housing 40 in plan view (FIG. 8a) and in side view.

In the case of this drive circuit, the temperature detector 26 is integrated in a semiconductor body 80 which is separate from the first and second semiconductor bodies 10, 20 and is likewise applied to the carrier element 30 in thermally conductive fashion. In the example, the third semiconductor body 80 is arranged spatially between the first and second semiconductor bodies 10, 20. In this case, the three semiconductor bodies are arranged in each case spaced apart from one another on one side of the carrier element.

In a manner that is not specifically illustrated, there is in particular also the possibility of arranging the first and second semiconductor bodies 10, 20 on a first side and the third semiconductor body 80 on a second side of the flat carrier element 30 remote from the first side. The spatial separation between the third semiconductor body 80 and the second semiconductor bodies 10, 20 is then effected by the carrier element 30, which additionally ensures a good thermal coupling. In this case, the third semiconductor body 80 with the temperature detector may in particular be arranged directly opposite the first semiconductor body with the first semiconductor switching element.

The terminals of this drive circuit correspond to the terminals of the drive circuit already explained with reference to FIGS. 1 and 2. In the case of the drive circuit in accordance with FIGS. 7 and 8, the terminal leg 27, via which the output signal of the temperature detector 26 can be tapped off, is connected to a terminal contact of the third semiconductor body 80.

Finally, it should also be pointed out that although the load terminals of the semiconductor switching elements 11, 21 in FIGS. 1 and 7 are directly connected to the supply potential terminals 12, 23 and the firing element terminals 13, 22, depending on the application, it goes without saying that further components may be connected between the load terminals and the corresponding supply potential terminals or firing terminals. Such components are in particular diodes which are intended to prevent a current flow via the body diodes integrated in power MOSFETs in the event of polarity reversal of the supply potential terminals.

It should furthermore be pointed out that the invention is not restricted to the arrangement of only one semiconductor switching element in each of the two semiconductor bodies 10, 20. It goes without saying that a plurality of separately drivable semiconductor switching elements may be arranged in each of the semiconductor bodies 10, 20 in order to be able to drive a plurality of firing elements of an occupant protection system separately by means of the drive circuit. A respective semiconductor switching element in the first semiconductor body and a semiconductor switching element in the second semiconductor body in this case form a switch pair for driving a firing element. The drive circuit has a number of first and second firing element terminals corresponding to the number of switch pairs, second load terminals of the first semiconductor switching elements integrated in the first semiconductor body being connected to the first firing element terminals, and first load terminals of the second semiconductor switching elements integrated in the second semiconductor body being connected to the second firing element terminals. In this case, first load terminals of the first semiconductor switching elements may be connected to a common first supply potential terminal or to separate first supply potential terminals of the drive circuit, and second load terminals of the second semiconductor switching elements may in this case be connected to a common second supply potential terminal or to separate second supply potential terminals of the drive circuit.

LIST OF REFERENCE SYMBOLS

GND Reference-ground potential
OTS Overtemperature signal
V+ Positive supply potential
Vref Reference voltage
Vt Thermal voltage
Z Firing element
264-266 Diodes
10, 20 Semiconductor bodies
11, 21 Semiconductor switching elements
12, 23 Supply potential terminals
13, 22 Firing element terminals
14, 24 Control terminals
15, 25 Driver circuits
18, 28 Control terminals
19 Control terminal
192 Bonding wire
26 Temperature detector
27 Output of the temperature detector
29 Control signal output
30 Thermally conductive carrier element, lead-frame
31 Reference-ground potential terminal of the carrier element
34 Thermally conductive and electrically insulating layer
35 Electrically conductive layer
40 Housing
50 Control circuit
60 Driver
70 Switch
103 Semiconductor substrate
104 Drain zone
105 Drift zone
106 Body zone
107 Source zone
108 Insulation layer
109 Gate electrode
110 Source electrode
111 Semiconductor connecting zone
112 Semiconductor zone doped complementarily with respect to the drift zone
121, 131 Bonding wires
122, 132 Load terminals
132 Bonding wire
181, 281 Bonding wires
182, 282 Terminal contacts
221, 231 Bonding wires
222, 232 Load terminals
261 Comparator
262 Reference voltage source
263 Current source
272 Terminal contact of the temperature detector

What is claimed is:

1. A drive circuit for at least one firing element of an occupant protection system, the drive circuit comprising:
   a first supply potential connection and a second supply potential connection;
   a first firing element connection and a second firing element connection;
   at least one first semiconductor switching element integrated in a first semiconductor body, the at least one first semiconductor switching element including a first load connection coupled to the first supply potential connection and a second load connection coupled to the first firing element connection;
   at least one second semiconductor switching element integrated in a second semiconductor body, the at least one second semiconductor switching element including a first load connection coupled to the second firing element connection and a second load connection coupled to the second supply potential connection;
   a single temperature detector operable to detect an overtemperature of the first semiconductor switching element, the temperature detector integrated in the second semiconductor body and configured to provide an over-temperature signal upon detection of an over-temperature;

a thermally conductive carder element to which the first semiconductor body and the second semiconductor body are applied; and a chip housing surrounding the first semiconductor body and the second semiconductor body.

2. The drive circuit of claim 1 wherein the carrier element comprises a metal.

3. The drive circuit of claim 2 wherein the metal comprises copper or aluminum.

4. The drive circuit of claim 1 wherein the first semiconductor body and the second semiconductor body are electrically conductively connected to the carrier element.

5. The drive circuit of claim 1 wherein at least one of the first semiconductor body and second semiconductor body is connected to the carrier element in a thermally conductive but electrically insulating fashion.

6. The drive circuit of claim 1 wherein the temperature detector comprises a temperature-dependent voltage source operable to provide a thermal voltage, a reference voltage source operable to provide a reference voltage, and a comparator operable to compare the thermal voltage with the reference voltage and provide the overtemperature signal.

7. The drive circuit of claim 6 wherein the temperature-dependent voltage source includes a current source and at least one diode connected in series with the current source, wherein the thermal voltage can be tapped off across the at least one diode.

8. The drive circuit of claim 1 further comprising a first drive connection configured to feed in a first drive signal for the first semiconductor switching element and a second drive connection configured to feed in a second drive signal for the second semiconductor switching element.

9. The drive circuit of claim 1 further comprising a drive connection configured to feed in a drive signal, and a driver circuit configured to generate drive signals for the first semiconductor switching element and the second semiconductor switching element from the drive signal fed in at the drive connection.

10. The drive circuit of claim 1 wherein the first semiconductor body is separated from the second semiconductor body on the thermally conductive carrier element.

11. A drive circuit for a firing element, the drive circuit comprising:

a plurality of semiconductor bodies;

a first semiconductor switching element included in a first of the plurality of semiconductor bodies, the first semiconductor switching element coupled to the firing element;

a second semiconductor switching element included in a second of the plurality of semiconductor bodies, the second semiconductor switching element coupled to the firing element;

a single temperature detector operable to detect an over-temperature of the first semiconductor switching element, the temperature detector included in one of the plurality of semiconductor bodies separate from the first semiconductor body, the temperature detector further operable to provide an over-temperature signal upon detection of an over-temperature of the first semiconductor switching element; and a thermally conductive carrier element, wherein the plurality of semiconductor bodies are connected to the thermally conductive carrier element.

12. The drive circuit of claim 11 wherein the first semiconductor switching element comprises a load connection connected to a supply potential connection of the drive circuit.

13. The drive circuit of claim 12 further comprising a switching element connected between the supply potential connection of the drive circuit and a connection for a supply potential.

14. The drive circuit of claim 13 further comprising a control circuit configured to receive the overtemperature signal and control the switching element.

15. The circuit arrangement of claim 13 wherein the switching element is a semiconductor switching element.

16. The circuit arrangement of claim 11 wherein the temperature detector is integrated in the second of the plurality of semiconductor bodies.

17. The circuit arrangement of claim 11 wherein the temperature detector is integrated in a third of the plurality of semiconductor bodies.

18. The drive circuit of claim 11 further comprising a chip housing surrounding the plurality of semiconductor bodies, wherein the first semiconductor body and the second semiconductor body are physically separated from each other within the chin housing.

* * * * *